(12) United States Patent
Honda et al.

(10) Patent No.: US 10,840,081 B2
(45) Date of Patent: Nov. 17, 2020

(54) LIQUID PROCESSING APPARATUS, LIQUID PROCESSING METHOD, AND STORAGE MEDIUM

(71) Applicant: Tokyo Electron Limited, Tokyo (JP)

(72) Inventors: Takumi Honda, Kumamoto (JP); Kazusige Sano, Kumamoto (JP); Hironobu Hyakutake, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/426,258

(22) Filed: May 30, 2019

(65) Prior Publication Data
US 2019/0371595 A1    Dec. 5, 2019

(30) Foreign Application Priority Data
May 31, 2018   (JP) .................. 2018-104493

(51) Int. Cl.
*H01L 21/00* (2006.01)
*H01L 21/02* (2006.01)
*H01L 21/67* (2006.01)

(52) U.S. Cl.
CPC .. *H01L 21/02019* (2013.01); *H01L 21/67086* (2013.01)

(58) Field of Classification Search
CPC ........ H01L 21/67017; H01L 21/02019; H01L 21/67086; H01L 21/67253; H01L 21/02274; H01L 21/02126; H01L 21/02312; H01L 21/3105; H01L 21/681
See application file for complete search history.

(56) References Cited

U.S. PATENT DOCUMENTS

| 5,730,162 A * | 3/1998 | Shindo ............. H01L 21/02052 134/66 |
| 6,158,447 A * | 12/2000 | Kamikawa ............... B08B 3/08 134/56 R |
| 6,203,627 B1 * | 3/2001 | Shindo ................... B08B 3/044 134/18 |

FOREIGN PATENT DOCUMENTS

| JP | 2011-077521 A | 4/2011 |
| JP | 6118739 B | 3/2017 |

* cited by examiner

*Primary Examiner* — Nikolay K Yushin
(74) *Attorney, Agent, or Firm* — Abelman, Frayne & Schwab

(57) ABSTRACT

A substrate liquid processing method includes immersing the substrate in a processing liquid for processing the substrate, detecting a conversion point at which a processing condition of the processing the substrate is changed, and changing the processing condition when the conversion point is detected.

19 Claims, 14 Drawing Sheets

FIG. 12A

| SET VALUE | PRESENT VALUE | CONCENTRATION DIFFERENCE | $N_2$ FLOW RATE |
|---|---|---|---|
| 91wt% | 88wt% | >+3wt% | 3L/min |
| 91wt% | 89wt% | +1.1~2.9wt% | 2L/min |
| 91wt% | 90wt% | <+1wt% | 1L/min |

FIG. 12B

| SET VALUE | PRESENT VALUE | CONCENTRATION DIFFERENCE | $N_2$ FLOW RATE |
|---|---|---|---|
| 162°C | 165°C | >+3°C | 3L/min |
| 162°C | 164°C | +1.1~2.9°C | 2L/min |
| 162°C | 163°C | <+1°C | 1L/min |

FIG. 13

| SET VALUE | PRESENT VALUE | CONCENTRATION DIFFERENCE | VENT FLOW RATE |
|---|---|---|---|
| 91wt% | 88wt% | >+3wt% | 10L/min |
| 91wt% | 89wt% | +1.1~2.9wt% | 7L/min |
| 91wt% | 90wt% | <+1wt% | 4L/min |

LIQUID PROCESSING APPARATUS, LIQUID PROCESSING METHOD, AND STORAGE MEDIUM

CROSS-REFERENCE TO RELATED APPLICATIONS

This application is based on and claims priority from Japanese Patent Application No. 2018-104493 filed on May 31, 2018 with the Japan Patent Office, the disclosure of which is incorporated herein in its entirety by reference.

TECHNICAL FIELD

The present disclosure relates to a liquid processing apparatus, a liquid processing method, and a storage medium.

BACKGROUND

In recent years, various types of semiconductor elements have been proposed. For example, Japanese Patent Laid-open Publication No. 2011-077521 discloses a semiconductor element in which a multilayer film is formed in a vertical direction. Such a semiconductor device is manufactured, for example, by the method disclosed in Japanese Patent No. 6118739, which discloses a method for manufacturing a semiconductor element described above by performing a pattern etching in which a substrate is immersed in a processing tank where a processing liquid is stored (immersion etching process).

SUMMARY

A liquid processing method according to the present disclosure includes immersing a substrate in the processing liquid, thereby processing the substrate, detecting a conversion point at which a processing condition of the step of processing the substrate is changed, and detecting the processing condition when the conversion point is detected.

A liquid processing apparatus according to the present disclosure is a liquid processing apparatus that performs a liquid processing on a substrate. The liquid processing apparatus includes: a processing liquid storage configured to store a processing liquid in which a substrate is immersed, and a processing liquid supply configured to supply the processing liquid to the processing liquid storage, a heater configured to heat the processing liquid, and a controller. The controller is configured to specify a conversion point based on information on a conversion point at which a processing condition for the substrate is changed, and control the processing liquid supply and the heater such that the processing condition is changed when the conversion point is specified.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 12A is a table representing a control example of a bubble generation mechanism during concentration change, and FIG. 12B is a table representing a control example of the bubble generation mechanism during temperature change.

FIG. 13 is a table representing a water vapor discharge control example in a substrate processing apparatus according to a fifth embodiment.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments will be described in detail with reference to the drawings. In the description, the same elements or elements having the same function will be denoted by the same symbols, and a redundant description will be omitted.

First Embodiment

Figure 1:
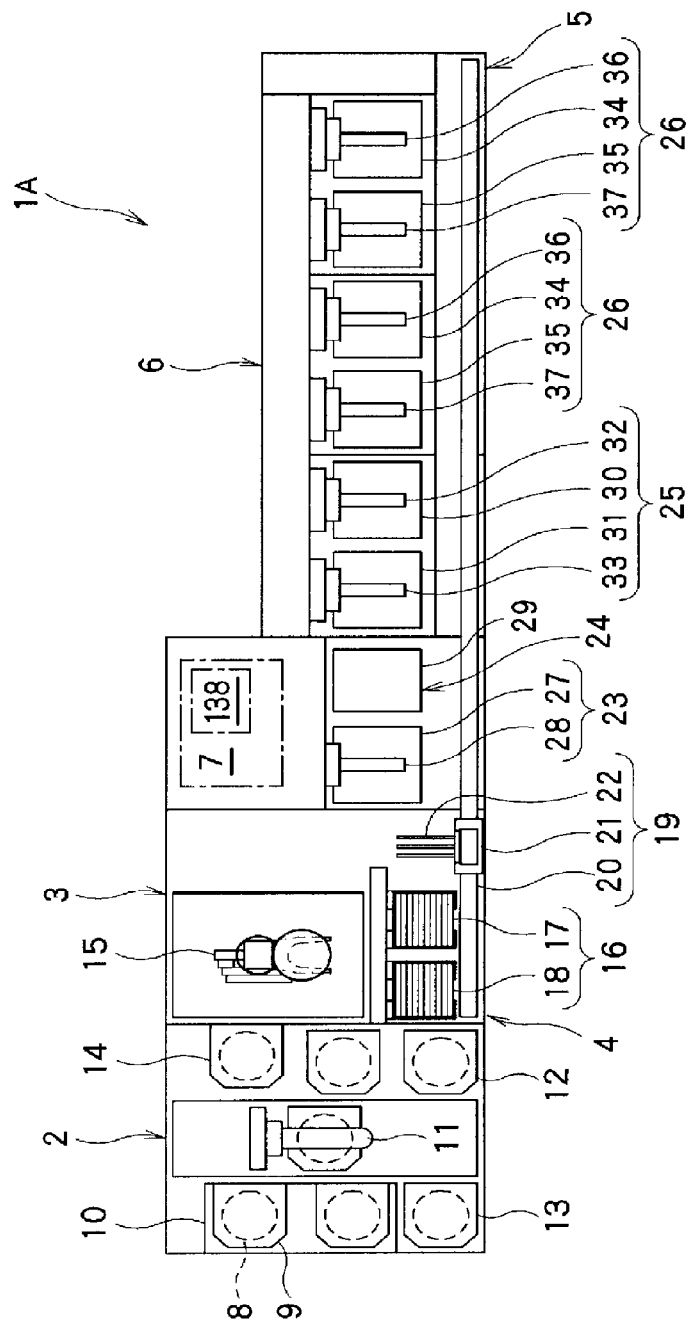
FIG. 1 is a plan view schematically illustrating a configuration of a liquid processing system according to a first embodiment.

As illustrated in FIG. 1, a liquid processing apparatus 1A according to a first embodiment includes a carrier carry-in/out section 2, a lot forming section 3, a lot placement section 4, a lot transport section 5, a lot processing section 6, and a controller 7.

Among these, the carrier carry-in/out section 2 is configured to perform carry-in/out of a carrier 9 containing a plurality of (e.g., 25) substrates (silicon wafers) 8 aligned vertically in a horizontal posture. The carrier carry-in/out section 2 is provided with a carrier stage 10 on which a plurality of carriers 9 are placed, a carrier transport mechanism 11 configured to transport the carriers 9, carrier stocks 12, 13 configured to temporarily store the carriers 9 therein, and a carrier placement table 14 configured to place a carrier 9 thereon. Here, the carrier stock 12 temporarily stores substrates 8 to be made into products before processing the substrates 8 in the lot processing section 6. Further, the carrier stock 13 temporarily stores the substrates 8 to be made into products after processing the substrates 8 in the lot processing section 6.

In addition, the carrier carry-in/out section 2 is configured to transport a carrier 9 carried from the outside into the carrier stage 10 to the carrier stock 12 or the carrier placement table 14 using the carrier transport mechanism 11. Then, the carrier carry-in/out section 2 is configured to transport the carrier 9 placed on the carrier placement table 14 to the carrier stock 13 or the carrier stage 10 using the carrier transport mechanism 11. The carrier 9 transported to the carrier stage 10 is carried out to the outside.

The lot forming section 3 forms a lot including a plurality of (e.g., 50) substrates 8 to be simultaneously processed by combining the substrates 8 accommodated in one or more carriers 9. In addition, when forming a lot, the lot may be formed such that the pattern-formed surfaces of the substrates 8 face each other, or may be formed such that all the pattern-formed surfaces of the substrates 8 are oriented in one direction. The lot formation section 3 is provided with a substrate transport mechanism 15 configured to transport a plurality of (e.g., 25) substrates 8. In addition, the substrate transport mechanism 15 is capable of changing the posture of the substrates 8 from the horizontal posture to the vertical posture and from the vertical posture to the horizontal posture in the course of transporting the substrates 8.

In addition, in the lot forming section 3, the substrates 8 are transported from the carrier 9 placed on the carrier placement table 14 to the lot placement section 4 using the substrate transport mechanism 15, and the substrates 8 forming a lot are placed on the lot placement section 4. Further, in the lot forming section 3, the lot placed on the lot placement section 4 is transported to the carrier 9 placed on the carrier placement table 14 by the substrate transport mechanism 15. In addition, the substrate transport mechanism 15 includes two types of support supports each configured to support a plurality of substrates 8, i.e., a to-be-processed substrate support configured to support substrates to be processed 8 (before being transported by the lot transport section 5), and a processed substrate support configured to support the processed substrates 8 (after having been transported by the lot transport section 5). This makes it possible to prevent, for example, particles attached to, for example, the substrates to be processed 8 from being transferred and attached to, for example, the processed substrates 8.

In the lot placement section 4, a lot transported between the lot forming section 3 and the lot processing section 6 by the lot transport section 5 is temporarily placed (stands by) on the lot placement table 16. The lot placement section 4 is provided with a carry-in side lot placement table 17 configured to place a processed lot (before being transported by the lot transport section 5) thereon and a carry-out side lot placement table 18 configured to place a lot to be processed (after having been transported by the lot transport section 5) thereon. A plurality of substrates 8 for one lot are arranged side by side in the vertical posture in the front and rear on each of the carry-in side lot placement table 17 and the carry-out side lot placement table 18.

Then, in the lot placement section 4, a lot formed by the lot forming section 3 is placed on the carry-in side lot placement table 17, and the lot is carried into the lot processing section 6 via the lot transport section 5. In addition, in the lot placement section 4, the lot carried out from the lot processing section 6 via the lot transport section 5 is placed on the carry-out side lot placement table 1, and the lot is transported to the lot forming section 3.

The lot transport section 5 transport lots between the lot placement section 4 and the lot processing section 6 or between internal portions of the lot processing section 6. The lot transport section 5 is provided with a lot transport mechanism 19 configured to perform lot transport. The lot transport mechanism 19 includes a rail 20 disposed along the lot placement section 4 and the lot processing section 6 and a moving body 21 configured to move along the rail 20 while holding a plurality of substrates 8. A substrate holder 22 configured to hold a plurality of substrates 8 aligned on the front and rear in a vertical posture is provided on the moving body 21 so as to be movable back and forth.

Then, the lot transport section 5 receives the lot placed on the carry-in side lot placement table 17 using the substrate holder 22 of the lot transport mechanism 19, and delivers the lot to the lot processing section 6. In addition, the lot transport section 5 receives the processed lot from the lot processing section 6 using the substrate holder 22 of the lot transport mechanism 19, and delivers the lot to the carry-out side lot placement table 18. Further, the lot transport section 5 transports the lot within the lot processing section 6 using the lot transport mechanism 19.

The lot processing section 6 performs processings such as, for example, etching, cleaning, and drying on a plurality of substrates 8 aligned on the front and rear in the vertical posture as one lot. The lot processing section 6 include a drying apparatus 23 configured to perform drying of the substrates 8, a substrate holder cleaning apparatus 24 configured to perform cleaning of the substrate holder 22, a cleaning apparatus 25 configured to perform cleaning of the substrates 8, and two etching apparatuses 26 according to the present disclosure configured to perform etching on the substrates 8, which are provided side by side.

The drying apparatus 23 has a processing tank 27 and a substrate lifting mechanism 28 provided in the processing tank 27 to be movable up and down. A processing gas for drying (e.g., isopropyl alcohol (IPA)) is supplied to the processing tank 27. In the substrate lifting mechanism 28, a plurality of substrates 8 for one lot are held side by side on the front and rear in the vertical posture. The drying apparatus 23 receives a lot from the substrate holder 22 of the lot transport mechanism 19 using the substrate lifting mechanism 28 and moves up and down the lot by the substrate lifting mechanism 28, thereby performing the drying of the substrates using the processing gas for drying supplied to the processing tank 27. Further, the drying apparatus 23 delivers the lot from the substrate lifting mechanism 28 to the substrate holder 22 of the lot transport mechanism 19.

The substrate holder cleaning apparatus 24 includes a processing tank 29 and is configured to be able to supply a processing liquid for cleaning and a drying gas to the processing tank 29. After supplying the processing liquid for cleaning to the substrate holder 22 of the lot transport mechanism 19, the cleaning of the substrate holder 22 is performed by supplying the drying gas.

The cleaning apparatus 25 includes a processing tank for cleaning 30 and a processing tank for rinsing 31, and substrate lifting mechanisms 32, 33 are respectively provided in the processing tanks 30, 31 so as to be movable up and down. In the processing tank for cleaning 30, a processing liquid for cleaning (e.g., SC-1) is stored. In the processing tank for rinsing 31, a processing liquid for rinsing (e.g., pure water) is stored.

The etching apparatus 26 includes a processing tank for etching 34 and a processing tank for rinsing 35, and substrate lifting mechanisms 36, 37 are respectively provided in the processing tanks 34, 35 so as to be movable up and down. In the processing tank for etching 34, a processing liquid for rinsing (e.g., phosphoric acid aqueous solution) is stored. In the processing tank for rinsing 35, a processing liquid for rinsing (e.g., pure water) is stored.

The cleaning apparatus 25 and the etching apparatus 26 have the same configuration. Referring to the etching apparatus 26, a plurality of substrates 8 for one lot are aligned and held on the front and rear in the vertical posture in the substrate lifting mechanism 36. In the etching apparatus 26, the substrate lifting mechanism 36 receives the lot from the substrate holder 22 of the lot transport mechanism 19 and moves up and down the lot, thereby immersing the lot in the processing liquid for etching in the processing tank 34 so as to perform etching of the substrates 8. Thereafter, the etching apparatus 26 delivers the lot from the substrate lifting mechanism 36 to the substrate holder 22 of the lot transport mechanism 19. In addition, the etching apparatus 26 receives the lot from the substrate holder 22 of the lot transport mechanism 19 using the substrate lifting mechanism 37, and moves up and down the lot by the substrate lifting mechanism 37, thereby immersing the lot in the processing liquid for rinsing in the processing tank 35 so as to perform rinsing of the substrates 8. Thereafter, the lot is delivered from the substrate lifting mechanism 37 to the substrate holder 22 of the lot transport mechanism 19.

The controller 7 controls the operations of respective sections (the carrier carry-in/carry-out section 2, the lot forming section 3, the lot placement section 4, the lot transport section 5, and the lot processing section 6) of the liquid processing apparatus 1A. The controller 7 is configured with, for example, a computer, and includes a computer-readable storage medium 138. In the storage medium 138, a program for controlling various processings executed in the liquid processing system 1A is stored. The controller 7 controls the operation of the liquid processing system 1A by reading and executing the program stored in the storage medium 138. In addition, the program may have been stored in the computer-readable storage medium 138 and installed from another storage medium to the storage medium 138 of the controller 7. The computer-readable storage medium 138 may be, for example, a hard disk (HD), a flexible disk (FD), a compact disk (CD), a magneto-optical disk (MO), or a memory card.

[Liquid Processing Apparatus]

Figure 2:
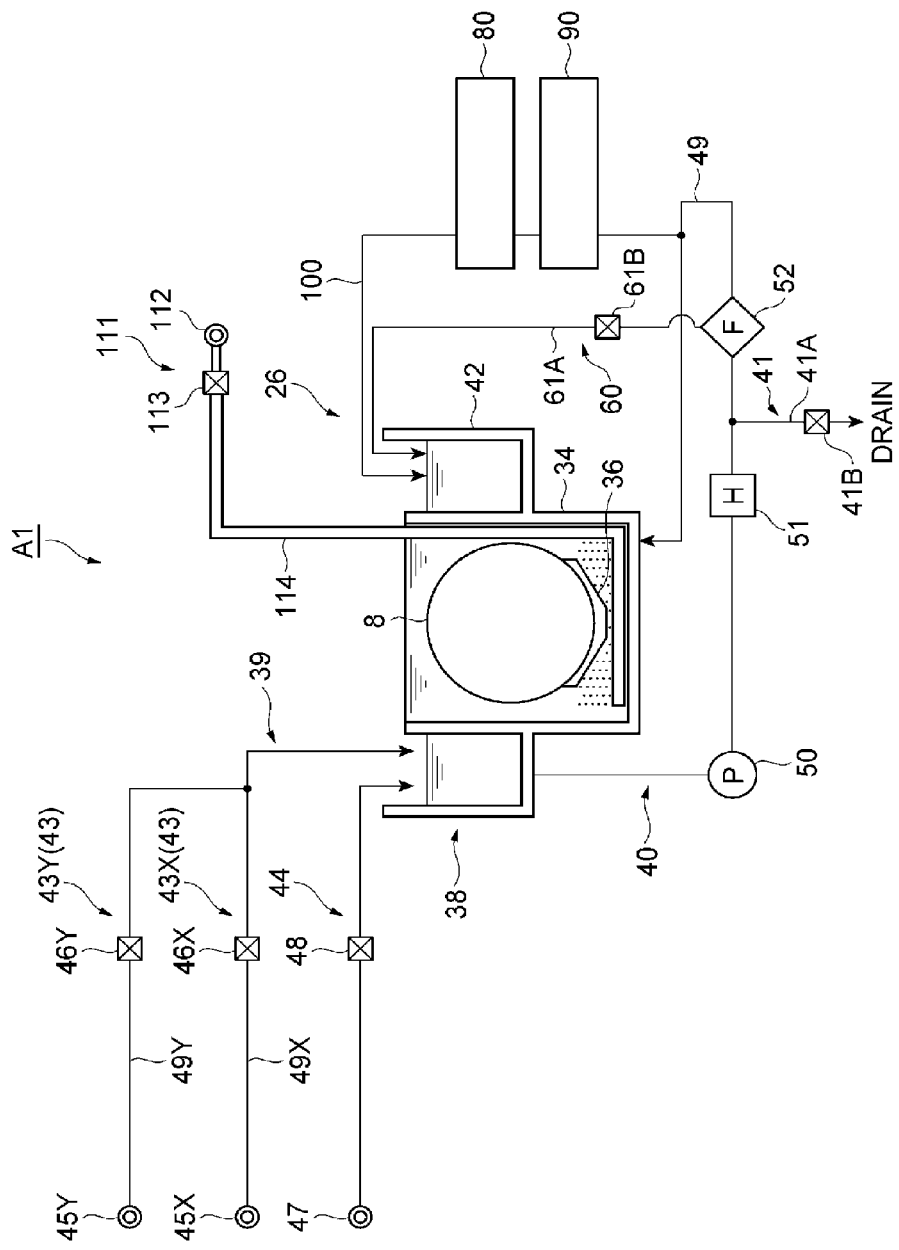
FIG. 2 is a schematic view illustrating a liquid processing apparatus according to the first embodiment.

Subsequently, a liquid processing apparatus A1 included in the liquid processing system 1A will be described in detail with reference to FIG. 2. As illustrated in FIG. 2, the liquid processing apparatus A1 is configured to include an etching apparatus 26.

The etching apparatus 26 performs a liquid processing (etching) on a substrate 8 using an aqueous solution of a chemical (phosphoric acid) having a predetermined concentration as a processing liquid for etching. As described later, the concentration of a processing liquid (phosphoric acid concentration) is appropriately changed. As illustrated in FIG. 2, the etching apparatus 26 includes a processing liquid storage section 38, a processing liquid supply section 39, a processing liquid circulation section 40, a processing liquid discharge section 41, a vent line 60, and a silicon concentration meter 80 (a detector), a phosphoric acid concentration meter 90, and a bubble generation mechanism 111.

The processing liquid storage section 38 stores the processing liquid so as to process the substrate 8. The processing liquid storage section 38 includes a top-opened outer tank 42 formed around the upper portion of a top-opened processing tank 34, and stores a processing liquid in the processing tank 34 and the outer tank 42. The processing tank 34 stores the processing liquid such that the substrate 8 is subjected to a liquid processing by being immersed in the processing liquid by the substrate lifting mechanism 36. The processing liquid overflowing from the processing tank 34 is stored in the outer tank 42. The processing liquid stored in the outer tank 42 is supplied to the processing tank 34 by the processing liquid circulation section 40. The outer tank 42 may be provided with a liquid level sensor (not illustrated) that detects the liquid level in the outer tank 42.

Figure 4B:
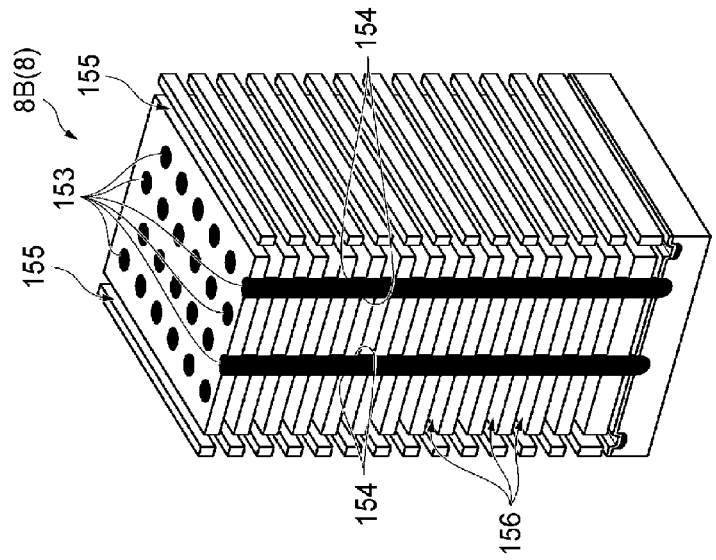
FIG. 4B is a view schematically illustrating an etched substrate.
Figure 4A:
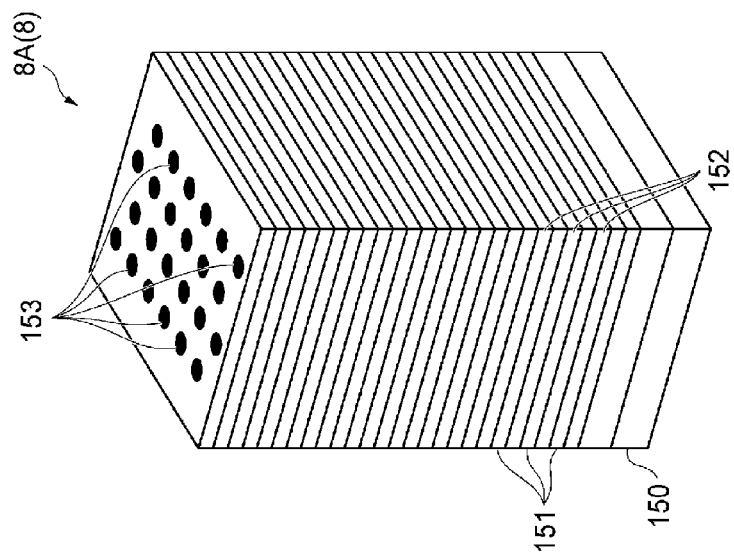
FIG. 4A is a view schematically illustrating a substrate to be etched (a semiconductor element)

Here, the substrates 8 subjected to a liquid processing (etching) in the process tank 34 will be described with reference to FIGS. 4A and 4B. FIG. 4A is a view schematically illustrating a substrate A which is a substrate to be etched 8A, and FIG. 4B is a view schematically showing a substrate 8B which is an etched substrate 8. As illustrated in FIG. 4A, the substrates to be etched 8A includes a substrate unit 150, a plurality of oxide films 151, a plurality of nitride films 152, a plurality of channel holes 153, and a plurality of blocking insulating films 154. The substrate unit 150 is formed of, for example, single crystal silicon. An impurity area is formed by doping impurity in a partial area of the substrate unit 150, and a lower insulating film and a lower electrode layer (both of which are not illustrated) are formed on the impurity area. In addition, the oxide films 151 and the nitride films 152 are formed (stacked) on the substrate unit 150 on which the lower electrode layer is formed. The oxide films 151 and the nitride films 152 are alternately stacked. The oxide films 151 are formed using, for example, silicon oxide. The nitride films 152 are formed using, for example, silicon nitride. Then, the upper electrode layer and the upper insulating film (both not illustrated) are formed on the uppermost oxide film 151 (both of which are not shown). The channel holes 153 extend so as to penetrate the oxide films 151 and the nitride films 152 in the stacking direction. The blocking insulating films 154 are formed on the side walls of channel holes 153, respectively.

As illustrated in FIG. 4B, in the substrate 8B to be subjected etching, an introduction portion 155 for introducing the processing liquid is formed in the stacking direction at the opposite end portions in the width direction. Then, when the processing liquid is introduced from the introduction portions 155, each of the nitride films 152 is removed by the processing liquid from the substrate 8B illustrated in FIG. 4B. By removing the nitride films 152, the areas where the nitride films 152 have been present become openings 156. In the openings 156, for example, a charge trapping layer, a blocking insulating film, and a control gate are formed.

Returning back to FIG. 2, the processing liquid supply section 39 supplies the processing liquid to the processing liquid storage section 38. The processing liquid supply section 39 includes an aqueous solution supply section 43 and a water supply section 44. The aqueous solution supply section 43 includes a first aqueous solution supply section 43X and a second aqueous solution supply section 43Y.

The first aqueous solution supply section 43X includes an aqueous solution supply source 45X, a valve 46X, and a flow path 49X. The aqueous solution supply source 45X supplies a phosphoric acid aqueous solution having a predetermined concentration. The phosphoric acid aqueous solution supplied from the aqueous solution supply source 45X is supplied to the processing liquid storage section 38 via the flow path 49X. The valve 46X is provided downstream of the aqueous solution supply source 45X in the flow path 49X. The valve 46X is connected to the controller 7, and subjected to an opening/close control and a flow rate control by the controller 7.

The second aqueous solution supply section 43Y includes an aqueous solution supply source 45Y, a valve 46Y, and a flow path 49Y. The aqueous solution supply source 45Y supplies a phosphoric acid aqueous solution having a predetermined concentration. The concentration (silicon concentration) of silicon (containing component) contained in the phosphoric acid aqueous solution supplied from the aqueous solution supply source 45Y is higher than the silicon concentration in the phosphoric acid aqueous solution supplied from the aqueous solution supply source 45X of the first aqueous solution supply section 43X described above. The phosphoric acid aqueous solution supplied from the aqueous solution supply source 45Y is supplied to the processing liquid storage section 38 through the flow path 49Y. The valve 46Y is provided downstream of the aqueous solution supply source 45Y in the flow path 49Y. The valve 46Y is connected to the controller 7, and subjected to an opening/close control and a flow rate control by the controller 7.

The water supply section 44 supplies water (pure water) to the processing liquid storage section 38. The water supply section 44 is connected to a water supply source 47 for supplying pure water at a predetermined temperature (e.g., the room temperature) to the outer tank 42 of the processing liquid storage section 38 through the valve 48. The valve 48 is connected to the controller 7, and subjected to an opening/close control and a flow rate control by the controller 7.

The processing liquid circulation section 40 sends the processing liquid in the outer tank 42 to the processing tank 34. The processing liquid circulation section 40 has a circulation flow path 49 (a circulation path), a pump 50, a heater 51 (a heating unit), and a filter 52. The circulation flow path 49 is a flow path extending from the bottom of the outer tank 42 of the processing liquid storage section 38 to the bottom of the processing tank 34, and circulates the processing liquid from the outer tank 42 to the processing tank 34. In the circulation flow path 49, a pump 50, a heater 51, and a filter 52 are provided in this order from the upstream side (the outer tank 42 side) to the downstream side (the processing tank 34 side). The pump 50 and the heater 51 are connected to the controller 7, and is subjected to a driving control by the controller 7. The pump 50 forcibly feeds the processing liquid from the upstream side to the downstream side. The heater 51 heats the processing liquid to a set temperature. The filter 52 removes particles mixed in the processing liquid.

The processing liquid discharge section 41 discharges the processing liquid from the circulation flow path 49 of the processing liquid circulation section 40. The processing liquid discharge section 41 has, for example, a drainage flow path 41A and a valve 41B. The drainage flow path 41A guides the processing liquid in the circulation flow path 49. One end of the drainage flow path 41A is connected to the circulation flow path 49, and the other end of the drainage flow path 41A is connected to a drainage pipe (not illustrated) of the liquid processing system 1A. The valve 41B is provided in the drainage flow path 41A. The valve 41B is connected to the controller 7, and is subjected to an opening/closing control by the controller 7.

The vent line 60 is configured to send the water vapor generated in the filter 52 of the circulation flow path 49 to the outer tank 42. The vent line 60 has a discharge flow path 61A and a valve 61B (a flow rate control valve). The discharge flow path 61A guides the water vapor generated in the filter 52 to the outer tank 42. One end of the discharge flow path 61A is connected to the filter 52, and the other end of the discharge flow path 61A is connected to the outer tank 42. The valve 61B is provided in the discharge flow path 61A. The valve 61B is connected to the controller 7, and is subjected to an opening/closing control by the controller 7.

The silicon concentration meter 80 is provided in a branch flow path 100 branched from the circulation flow path 49 and extending toward the outer tank 42, and measures the concentration of silicon (silicon concentration) contained in the processing liquid. The silicon concentration meter 80 functions as a detector that detects the concentration of silicon (silicon concentration) in the processing liquid contained in the processing liquid as information related to a conversion point described later. The silicon concentration meter 80 outputs the measured silicon concentration to the controller 7. The silicon concentration is used to specify a conversion point by the controller 7 (details will be described later). The phosphoric acid concentration meter 90 is provided in the branch flow channel 100, and measures the phosphoric acid concentration in the processing liquid. The phosphoric acid concentration meter 90 outputs the measured phosphoric acid concentration to the controller 7.

The bubble generation mechanism 111 performs bubbling in the processing liquid storage section 38. The bubble generation mechanism 111 has a nitrogen supply source 112, a valve 113, and a supply pipe 114. The nitrogen source 112 supplies nitrogen. The nitrogen supplied from the nitrogen supply source 112 is supplied to the processing tank 34 of the processing liquid storage section 38 through the supply pipe 114. One end of the supply pipe 114 is connected to the nitrogen source 112, and the other end extends along the bottom of the processing tank 34. A plurality of gas nozzles are formed on the other end side of the supply pipe 114 (a portion extending to face the processing tank 34), and nitrogen gas used for bubbling is ejected from the gas nozzles. The valve 113 is provided downstream of the nitrogen supply source 112 in the supply pipe 114. The valve 113 is connected to the controller 7, and subjected to an opening/close control and a flow rate control by the controller 7. Since the bubbling is generated in the processing tank 34 by the bubble generation mechanism 111, an upward flow of the processing liquid occurs in the processing tank 34. This makes it easy to keep the state of the processing liquid uniform.

Subsequently, the controller 7 that controls the etching apparatus 26 will be described in detail. For example, in the substrate processing period in which the substrate 8 is immersed in the processing liquid of the processing tank 34, the controller 7 is configured to specify the conversion point based on the information related to the conversion point at which processing conditions for the substrate 8 are changed, and control the processing liquid supply section 39 such that the processing conditions are changed when the conversion point is specified. In the present embodiment, as the processing conditions for the substrate 8, the concentration of the processing liquid and the silicon concentration in the processing liquid are changed.

Figure 5:
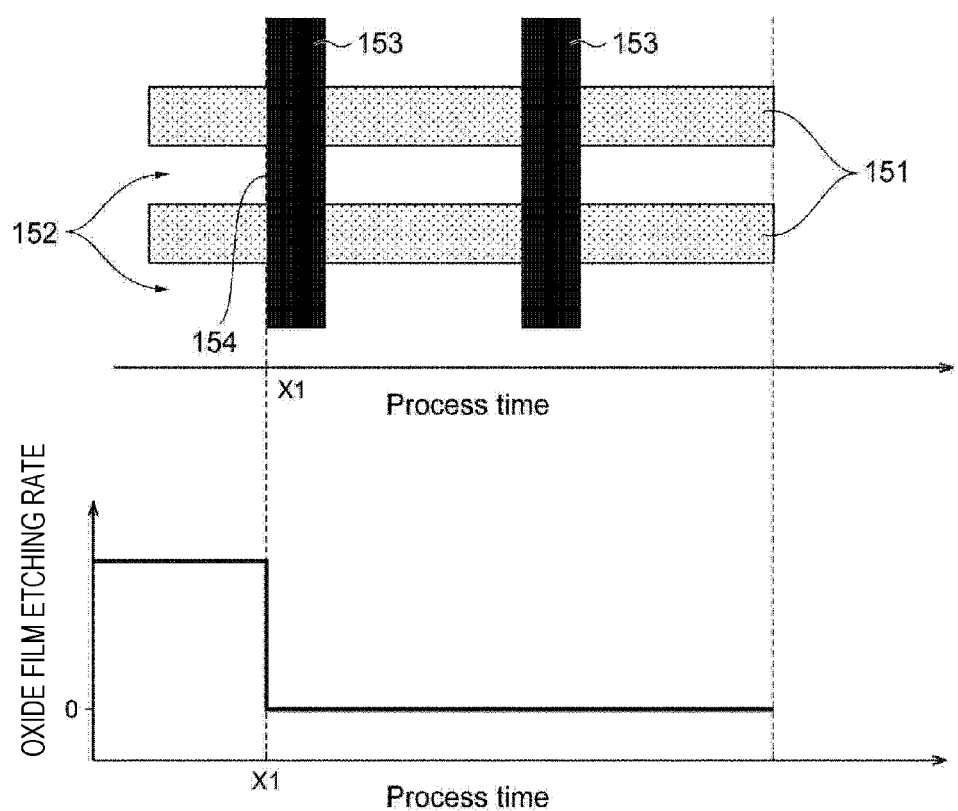
FIG. 5 is a graph representing an ideal etching rate according to a pattern shape.

First, the processing images of the controller 7 will be described with reference to FIGS. 4A to 7. As described above with reference to FIGS. 4A and 4B, the nitride films 152 of a substrate 8 are removed (etched) by a processing liquid. Here, as illustrated in FIG. 4B, a blocking insulating film 154 is formed on the side wall of each channel hole 153. When the etching rate of the processing liquid (the etching rate for the oxide film (the same applies to the following)) is not changed at all in the state in which the removal of the nitride films 152 proceeds and the blocking insulating films 154 are exposed, the blocking insulating films 154 may be largely removed by the processing liquid as time passes. In particular, the blocking insulating films 154 on the side where etching is first started among the side walls of the channel holes 153 will be etched for a long time, and will be removed more remarkably. Therefore, the controller 7 of the etching apparatus 26 of the present embodiment changes the etching rate of the processing liquid based on the processing situation according to the pattern shape of the substrate 8. In FIG. 5, the horizontal axis represents an etching time, and the vertical axis in the lower drawing represents the etching rate for an oxide film. The upper drawing schematically represents the positions of oxide films 151, nitride films 152, channel holes 153, and blocking insulating films in the substrate 8. As represented in FIG. 5, before the etching time X1 (that is, before reaching the positions of the blocking insulating films 154 formed on the side walls of the channel holes 153), the controller 7 sets the etching rate of the processing liquid to a relatively high value, and after the etching time X1, the controller 7 lowers the etching rate of the processing liquid (to a value close to 0) (see the lower drawing in FIG. 5). In FIG. 5, the etching rate is instantaneously lowered to the desired value at the etching time X1, but in fact, the etching rate gradually approaches the desired value by changing the concentration of the processing liquid and the silicon concentration described later. The content of suppressing the removal of the blocking insulating films 154 described above is an example, and the control of the controller 7 is not limited to this purpose.

Figure 6:
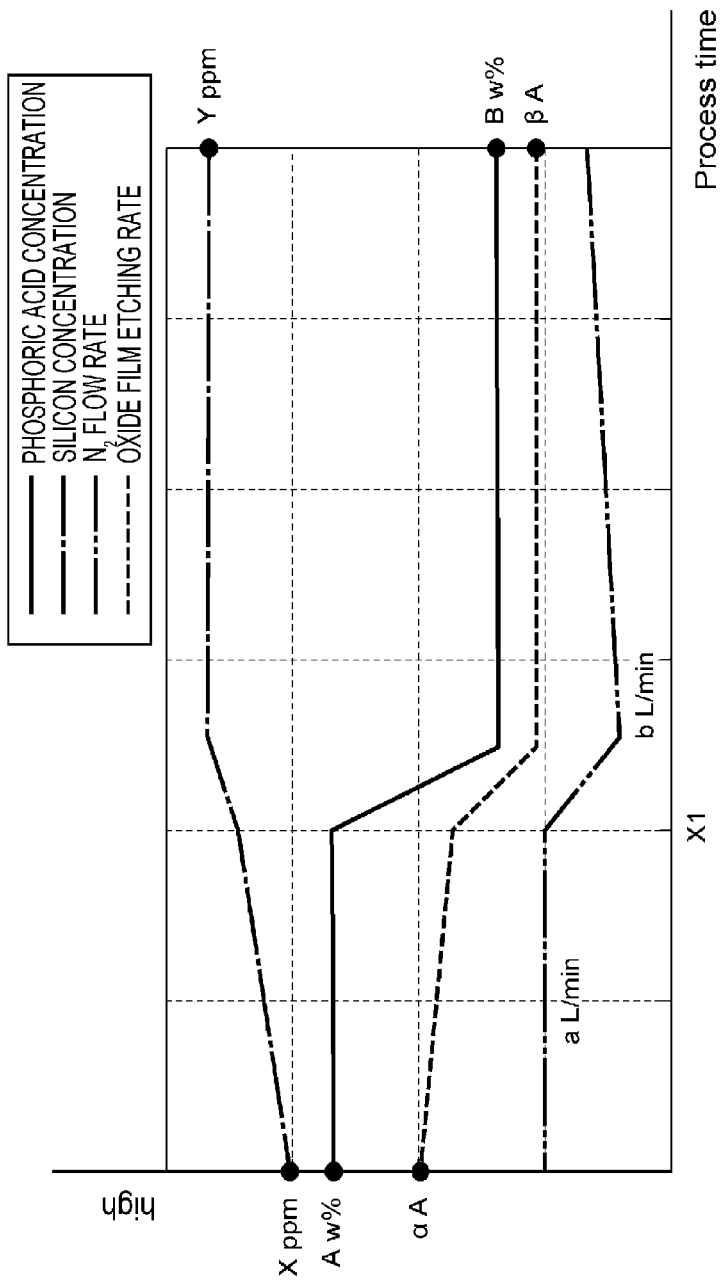
FIG. 6 is a graph representing an example of changing processing parameters at conversion points.
Figure 7:
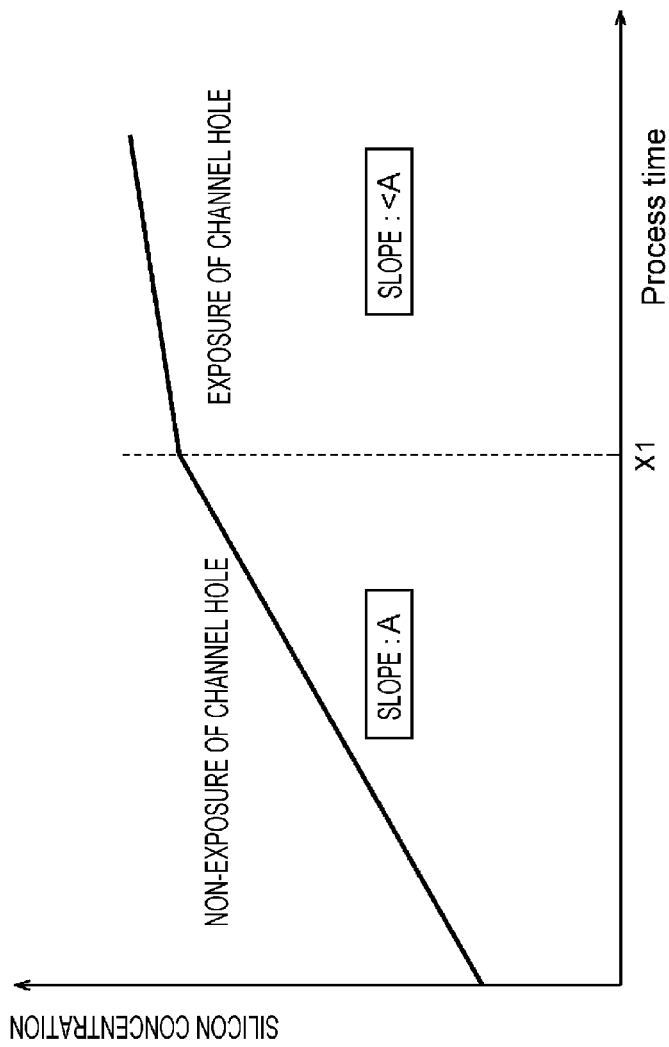
FIG. 7 is a graph representing an exemplary temporal change of silicon concentration.

As a process at the time of decreasing the etching rate of the processing liquid, specifically, as illustrated in FIG. 6, upon detecting the conversion point at the timing when the etching time X1 is reached, the controller 7 lowers the etching rate of the processing liquid by decreasing the concentration of the processing liquid (phosphoric acid concentration) and increasing the silicon concentration in the processing liquid (the details will be described later). In addition, as illustrated in FIG. 7, the controller 7 specifies a change point of the slope of the temporal change of the silicon concentration in the processing liquid as a conversion point (the details will be described later). In addition, upon detecting the conversion point, the controller 7 may control the heater 51 to lower the temperature of the processing liquid, thereby lowering the etching rate of the processing liquid for the blocking insulating films 154.

Figure 3:
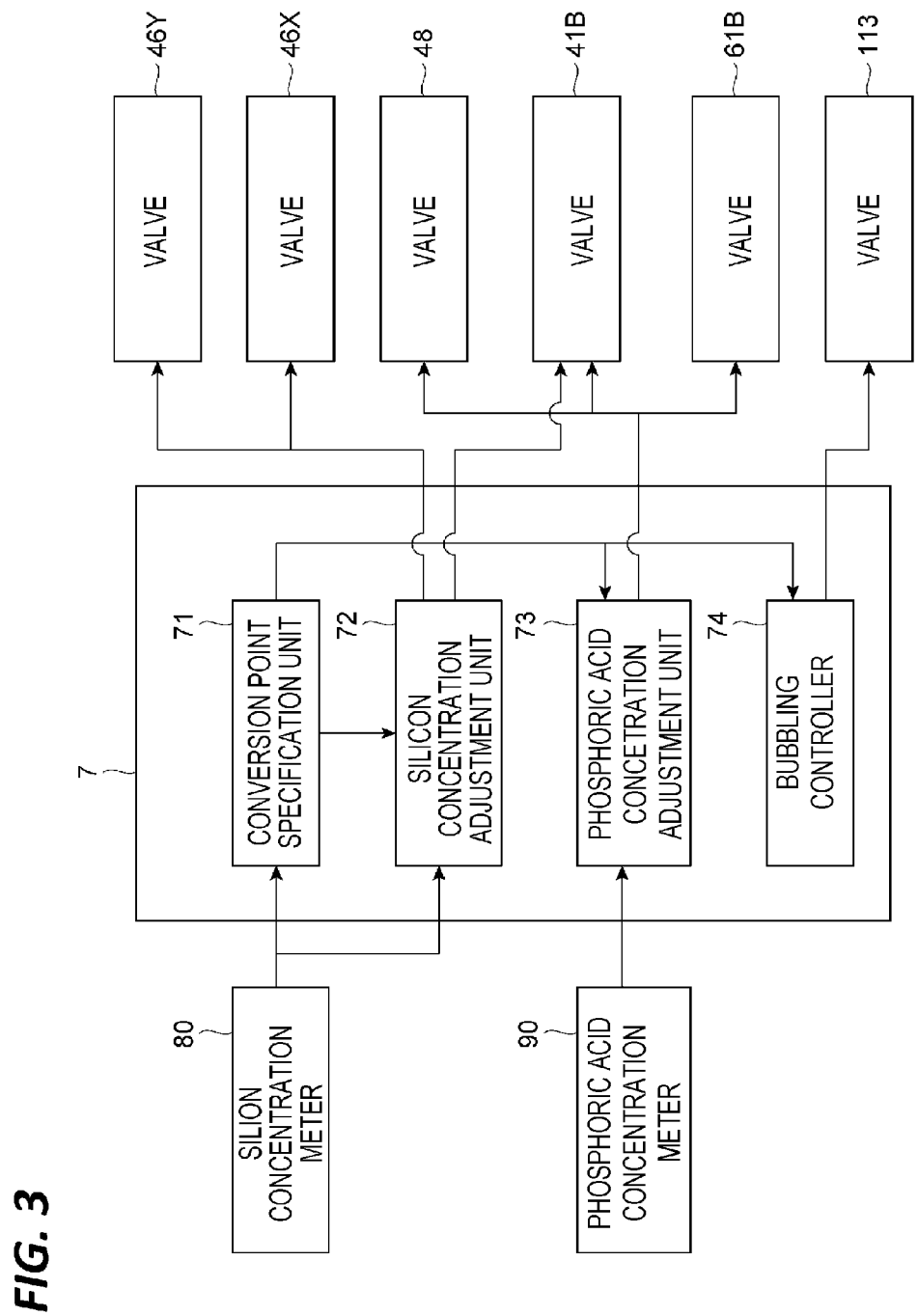
FIG. 3 is a block diagram illustrating a functional configuration of a controller according to the first embodiment.

Subsequently, a specific functional configuration of the controller 7 will be described with reference to FIG. 3. FIG. 3 is a block diagram illustrating a functional configuration of the controller 7. As illustrated in FIG. 3, the controller 7 includes a conversion point specification unit 71, a silicon concentration adjustment unit 72, a phosphoric acid concentration adjustment unit 73, and a bubbling controller 74.

The conversion point specification unit 71 specifies a conversion point (determines whether or not the conversion point is reached) based on information on the conversion point at which the processing condition for the substrate 8 is changed. The information related to the conversion point is, for example, the silicon concentration in the processing liquid acquired from, for example, the silicon concentration meter 80. The conversion point specification unit 71 specifies the change point of the slope of the temporal change of the silicon concentration in the processing liquid as a conversion point. FIG. 7 represents an exemplary temporal change of the silicon concentration, in which the horizontal axis represents time and the vertical axis represents silicon concentration. As represented in FIG. 7, the silicon concentration has a gradual increase in silicon concentration per unit time (the slope of temporal change of the silicon concentration) from the etching time X1 at which the channel holes 153 are exposed (specifically, the blocking insulating films 154 is exposed). That is, as represented in FIG. 7, the slope of the temporal change of the silicon concentration after the etching time X1 becomes slower than the slope A of the temporal change of the silicon concentration before the etching time X1. As represented in FIG. 5, this is based on the fact that the nitride films 152 are removed until the blocking insulating films 154 are exposed (until the etching time X1 is reached), but when the etching time X1 is reached, the processing cross-sectional area of the nitride films 152 is decreased, the amount of the nitride film 152 to be newly removed is decreased, and thus the increase in silicon concentration in the processing liquid is decreased. The conversion point specification unit 71 specifies the point at which the etching time X1 is reached as the conversion point with high accuracy by specifying the point at which the slope of the temporal change of the silicon concentration in the processing liquid becomes slower as the conversion point.

When the conversion point is specified by the conversion point specification unit 71, the silicon concentration adjustment unit 72 controls the valves 46 X, 46Y of the processing liquid supply section 39 such that the silicon concentration in the processing liquid, which is the processing condition, is changed. Specifically, in the step before the conversion point is specified (detected) after the start of the etching, the silicon concentration adjustment unit 72 opens the valve 46X such that the processing liquid is supplied to the processing liquid storage section 38 from the aqueous solution supply source 45X of the first aqueous solution supply section 43X. The silicon concentration adjustment unit 72 closes the valve 46Y of the second aqueous solution supply section 43Y. In this case, the processing liquid storage section 38 is supplied with a low-silicon-concentration processing liquid having a relatively low silicon concentration. In addition, when the conversion point is specified (detected), the silicon concentration adjustment unit 72 closes the valve 46X and opens the valve 46Y such that a high-silicon-concentration processing liquid is supplied to the processing liquid storage section 38 from the aqueous solution supply source 45Y of the second aqueous solution supply section 43Y. As described above, the silicon concentration adjustment unit 72 controls the valves 46X, 46Y of the processing liquid supply section 39 such that the silicon concentration in the processing liquid increases when the conversion point is specified.

FIG. 6 represents an example of changing a processing parameter at a conversion point. The horizontal axis in FIG. 6 represents etching time, and the vertical axis represents the levels of phosphoric acid concentration, silicon concentration, nitrogen ($N_2$) flow rate, and oxide film etching rate. As represented in FIG. 6, the silicon concentration in the processing liquid is, for example, X [ppm] at the start of etching, and then the silicon concentration in the processing liquid is increased as the etching of the nitride film 152 progresses. When, when the etching time X1 is reached (the conversion point is specified), as described above, the high-silicon-concentration processing liquid is supplied to the processing liquid storage section 38, and the silicon concentration in the processing liquid further increases. The silicon concentration adjustment unit 72 acquires the silicon concentration in the processing liquid from the silicon concentration meter 80, and when the silicon concentration rises to Y [ppm] higher than X [ppm] (see, e.g., FIG. 6), the silicon concentration adjustment unit 72 controls the valve 41B such that the silicon concentration in the liquid thereafter becomes constant at Y [ppm], thereby performing a silicon concentration-constant control.

When the conversion point is specified by the conversion point specification unit 71, the phosphoric acid concentration adjustment unit 73 controls the valve 48 of the processing liquid supply section 39 such that the concentration of the processing liquid (phosphoric acid concentration), which is the processing condition, is changed. The phosphoric acid concentration adjustment unit 73 adjusts the concentration of the processing liquid by adjusting the opening degree of the valve 48 of the water supply section 44. The phosphoric acid concentration adjustment unit 73 adjusts the opening degree of the valve 48 of the water supply section 44 to increase the water supply amount from the water supply section 44 to the processing liquid storage section 38 in order to reduce the concentration of the processing liquid when the conversion point is specified. In addition, the phosphoric acid concentration adjustment unit 73 adjusts the discharge amount of the water vapor and shortens the time required for changing the concentration and temperature of the processing liquid by adjusting the opening degree of the valve 61B of the vent line 60. For example, in the case in which the concentration is increased or the temperature is decreased, the phosphoric acid concentration adjustment unit 73 adjusts the opening degree of the valve 61B so as to increase the discharge amount of the water vapor discharged in the vent line 60, thereby shortening the time required for increasing the concentration or decreasing the temperature. In addition, in the case in which the concentration is reduced, since the amount of water supplied from the water supply section 44 to the processing liquid storage section 38 increases, the liquid level in the processing liquid storage section 38 rises excessively and the liquid level control may not be appropriately performed. For this reason, in the case in which the amount of water supplied to the processing liquid storage section 38, the phosphoric acid concentration adjustment unit 73 may discharge the processing liquid from the processing liquid storage section 38 and suppress the rise in liquid level in the processing liquid storage section 38 by opening the valve 41B of the processing liquid discharge section 41.

As represented in FIG. 6, the concentration of the processing liquid (phosphoric acid concentration) is, for example, A [w %] at the start of etching, and the phosphoric acid concentration is maintained until the etching time X1 is reached. In addition, when the etching time X1 is reached (when the conversion point is specified), the valve 48 is controlled by the phosphoric acid concentration adjustment unit 73, whereby the phosphoric acid concentration is decreased. The phosphoric acid concentration adjustment unit 73 acquires the phosphoric acid concentration from the phosphoric acid concentration meter 90, and when the phosphoric acid concentration is decreased to B [w %] lower than A [w %] (see, e.g., FIG. 6), then a phosphoric acid concentration-constant control is performed such that the phosphoric acid concentration is made to be constant at B [w %].

As illustrated in FIG. 6, the oxide film etching rate decreases (increases in the amount of decrease) from the conversion point by performing a control of increasing the silicon concentration and decreasing the phosphoric acid concentration at the conversion point. That is, the oxide film etching rate is, for example, α [A] at the start of etching, and then gradually decreases as the etching progresses. Then, when the etching time X1 is reached, the above-described control of increasing the silicon concentration and decreasing the phosphoric acid concentration is performed, and the amount of decrease in the oxide film etching rate becomes large. Thereafter, when the etching area is decreased to β [A] lower than α [A], the above-described silicon concentration-constant control and phosphoric acid concentration-constant control are performed, and the oxide film etching rate is also controlled to be a constant value (β [A]).

The bubbling controller 74 adjusts the opening degree of the valve 113 of the bubble generation mechanism 111 such that a predetermined bubbling process is performed in the processing liquid storage section 38. The bubbling controller 74 controls the bubbling process to correspond to the adjustment of the phosphoric acid concentration by the phosphoric acid concentration adjustment unit 73. That is, as illustrated in FIG. 6, the opening degree of the valve 113 is adjusted such that the flow rate of nitrogen related to the bubbling becomes a [L/min] from the start of etching to the etching time X1. Then, when the etching time X1 is reached (when the conversion point is specified), the opening degree of the valve 113 is adjusted by the bubbling controller 74, whereby the nitrogen flow rate related to the bubbling is reduced. The bubbling controller 74 reduces the flow rate of nitrogen until the flow rate of nitrogen reaches b [L/min]. Thus, the bubbling controller 74 reduces the flow rate of nitrogen related to the bubbling according to the decrease in the phosphoric acid concentration. In addition, when the flow rate of nitrogen is decreased to b [L/min], the bubbling controller 74 gradually increases the flow rate of nitrogen thereafter. Therefore, it is possible to perform nitrogen gas substitution evenly in the processing liquid, thereby suppressing re-deposition of an oxide film.

[Liquid Processing Method]

Figure 8:
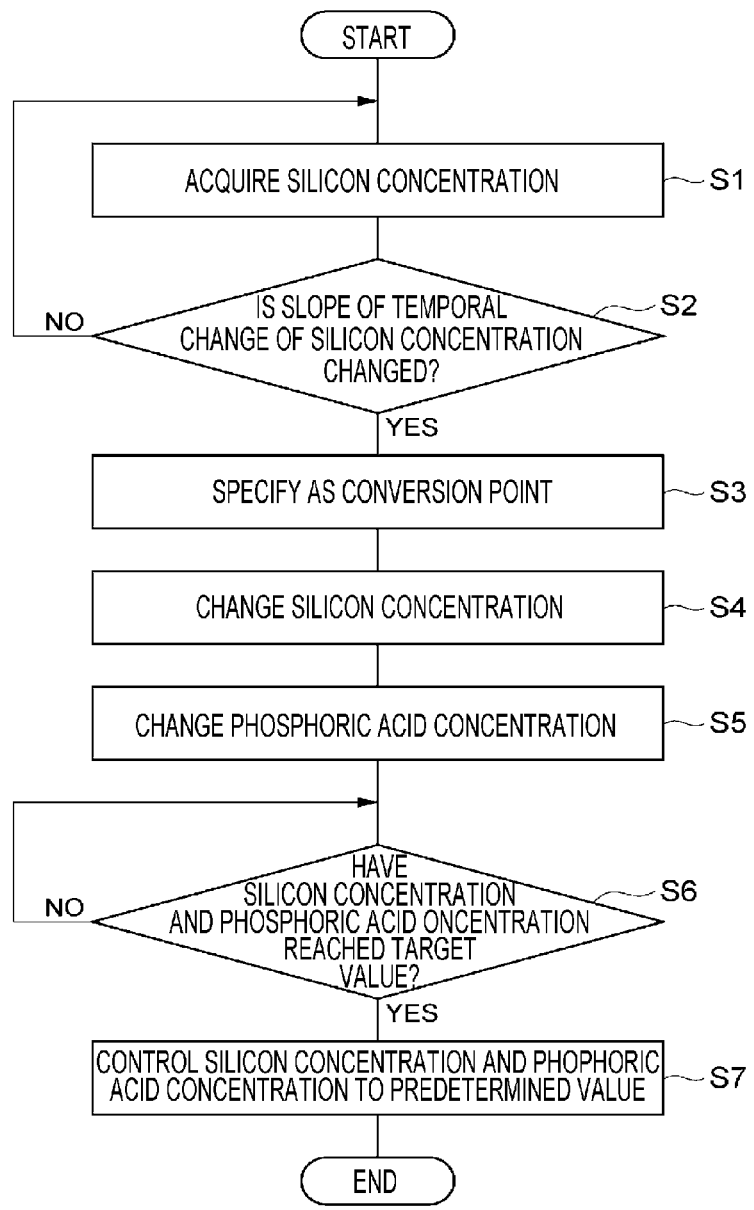
FIG. 8 is a flowchart of a liquid processing.

Next, an exemplary liquid processing method will be described with reference to FIG. 8. FIG. 8 is a flowchart of a liquid processing, and more specifically, a flowchart illustrating a process of changing the concentration of a processing liquid, which is a processing condition, and the silicon concentration in the processing liquid.

As illustrated in FIG. 8, the controller 7 continuously (at predetermined time intervals) acquires the silicon concentration in the processing liquid detected by the silicon concentration meter 80 (step S1). The controller 7 determines whether or not the slope of the temporal change of the silicon concentration is changed by a predetermined amount (step S2). Specifically, the controller 7 determines whether or not the increase amount of the silicon concentration in unit time is gentle (the slope is small) by a predetermined amount. When it is determined in step S2 that the slope of the temporal change of the silicon concentration is not changed by a predetermined amount, the controller 7 continues to acquire the silicon concentration (that is, execute step S1) and executes step S2 again after the lapse of a predetermined time. Meanwhile, when it is determined in step S2 that the slope of the temporal change of the silicon concentration is changed by a predetermined amount, the controller 7 specifies that the etching area reaches the conversion point (step S3).

Subsequently, the controller 7 controls the valves 46X, 46Y of the processing liquid supply section 39 such that the silicon concentration which is the processing condition is changed (step S4). Specifically, in order to ensure that the silicon concentration in the processing liquid is increased, the controller 7 closes the valve 46X of the first aqueous solution supply section 43X that supplies the low-silicon-concentration processing liquid, and opens the valve 46Y of the second aqueous solution supply section 43Y that supplies the high-silicon-concentration processing liquid.

In addition, the controller 7 controls the valve 48 of the processing liquid supply section 39 such that the phosphoric acid concentration which is the processing condition is changed (step S5). Specifically, the controller 7 adjusts the opening degree of the valve 48 of the water supply section 44 so as to increase the amount of water supplied to the processing liquid storage section 38, thereby reducing the concentration of the processing liquid (phosphoric acid concentration). In addition, step S5 may be performed prior to step S4 or may be performed simultaneously with step S4.

Subsequently, the controller 7 determines whether or not the silicon concentration and the phosphoric acid concentration reach a target value (step S6). When at least one of the silicon concentration acquired from the silicon concentration meter 80 and the phosphoric acid concentration acquired from the phosphoric acid concentration meter 90 does not reach the target value, the controller causes the processing in step S6 to be performed after the lapse of a predetermined time. Meanwhile, when the silicon concentration acquired from the silicon concentration meter 80 and the phosphoric acid concentration acquired from the phosphoric acid concentration meter 90 both reach the target value, the controller 7 controls the processing liquid supply section 39 such that the silicon concentration and the phosphoric acid concentration are maintained at the target value (step S7). The foregoing is the liquid processing (specifically, the process of changing the concentration of the processing liquid and the silicon concentration in the processing liquid which are the processing conditions).

[Acting Effect]

In recent years, semiconductor devices having various pattern shapes have been proposed. In the method of performing pattern etching by immersing a substrate in a processing tank in which a processing liquid is stored, it may be desirable to change processing parameters during the processing according to a pattern shape. For example, in a substrate 8 in which the blocking insulating film 154 is formed on the side wall of each channel hole 153 as illustrated in FIGS. 4A and 4B, it may be required to reduce the etching rate of the processing liquid for the oxide film in order to avoid significant removal of the film 154 in the state in which the removal of the nitride film 152 proceeds and the blocking insulating film 154 is exposed. That is, during the immersion etching process, it is required to appropriately change the processing conditions (processing parameters) at an intended timing (predetermined desired timing).

In this respect, the liquid processing method according to the present embodiment includes a step of processing the substrate 8 by immersing the substrate 8 in the processing liquid, a step of detecting a conversion point at which the processing condition of the step of processing the substrate 8, and a step of changing the processing condition when the conversion point is detected. In this manner, in the liquid processing method according to the present embodiment, when the conversion point at which the processing condition of the step of processing the substrate 8 is changed is detected, the processing condition is changed. By defining the timing (conversion point) at which the processing condition is changed in advance and changing the processing condition when the conversion point is detected, it is possible to change the processing condition (processing parameter) at a desired timing during the immersion etching process. That is, in the example described above, by setting the timing at which the blocking insulating films 154 are exposed as a conversion point, when the blocking insulating film 154 is exposed, it becomes possible to change processing conditions such as the phosphoric acid concentration in order to lower the etching rate for the oxide film.

In the step of detecting the conversion point described above, the concentration of silicon, which is a component contained in the processing liquid, in the processing liquid (silicon concentration) is detected, and the conversion point is detected based on the slope of the temporal change of the silicon concentration. As described above, after the etching proceeds and the channel holes 153 (specifically, the blocking insulating films 154) are exposed, it is desired to reduce the etching rate of the oxide film in order to suppress the blocking insulating films 154 from being removed. In such a case, it is important to detect the timing at which the blocking insulating films 154 are exposed as a conversion point through a certain method. Here, since the removed amount of the nitride film 152 is largely different before and after the blocking insulating films 154 are exposed, the slope of the temporal change of the silicon concentration in the processing liquid is changed. Taking this into consideration, by detecting the conversion point based on the slope of the temporal change of the silicon concentration, it is possible to appropriately detect the timing at which a processing parameter (specifically, the timing at which the blocking insulating films 154 are exposed) is changed.

In the step of changing the processing conditions described above, at least one of the concentration of the processing liquid (phosphoric acid concentration) and the concentration of a component, which is contained in the processing liquid, in the processing liquid (silicon concentration) when the conversion point is detected. In this manner, by changing at least one of the phosphoric acid concentration and the silicon concentration, it is possible to appropriately change the etching rate of the oxide film, which is a processing parameter.

In the step of changing the processing conditions described above, when the conversion point is detected, the concentration of the processing liquid is reduced. Thus, for example, in the case in which the timing at which the channel holes 153 are exposed (specifically, the blocking insulating films 154 are exposed) becomes a conversion point, it is possible to appropriately reduce the etching rate of the processing liquid for the oxide film by decreasing the concentration of the processing liquid (phosphate concentration) at the timing at which it is desired to suppress the blocking insulating films 154.

In the step of changing the processing conditions described above, the concentration of a component, which is contained in the processing liquid, in the processing liquid (silicon concentration) is increased when the conversion point is detected. Thus, for example, in the case in which the timing at which the channel holes 153 are exposed (specifically, the blocking insulating films 154 are exposed) becomes a conversion point, it is possible to appropriately reduce the etching rate of the processing liquid for the oxide film by increasing the silicon concentration at the timing at which it is desired to suppress the blocking insulating films 154.

In the step of changing the processing conditions described above, the volume of the processing liquid in which the substrate 8 is immersed is changed. Thus, for example, by increasing the supply amount of water to the processing liquid storage section 38 to increase the volume of the processing liquid, it is possible to appropriately and easily decrease (change) the concentration of the processing liquid (phosphoric acid concentration). In the step of changing the processing conditions, the heater 51 may be controlled to lower the temperature of the processing liquid when the conversion point is detected. Thus, it is possible to appropriately decrease the etching rate of the processing liquid for the oxide films.

In order to implement the liquid processing method described above, the liquid processing apparatus A1 according to the present embodiment is a liquid processing apparatus that performs a liquid processing on a substrate 8 by immersing the substrate 8 in the processing liquid. The liquid processing apparatus includes a processing liquid storage section 38 configured to store liquid therein, a processing liquid supply section 39 configured to supply the processing liquid to the processing liquid storage section 38, and a controller 7 configured to specify a conversion point based on information on the conversion point at which a processing condition for the substrate 8 is changed and control the processing liquid supply section 39 such that the processing condition is changed when the conversion point is specified. As described above, by defining the timing (conversion point) at which the processing condition is changed in advance and changing the processing condition when the conversion point is detected, it is possible to change the processing condition (processing parameter) at a desired timing during the immersion etching process. In addition, by controlling the processing liquid supply section 39 that supplies the processing liquid, it is possible to easily and reliably change the concentration of the processing liquid among the processing conditions.

The above-described liquid processing apparatus A1 includes a silicon concentration meter 80 that detects the concentration of a component contained in the processing liquid (silicon) in the processing liquid (silicon concentration) as information on the conversion point. Therefore, it is possible to appropriately and easily acquire the silicon concentration used to detect the conversion point.

The controller 7 specifies, as a conversion point, a change point of the slope of the temporal change of the concentration of a component which is contained in the processing liquid (silicon) in the processing liquid (silicon concentration). Therefore, it is possible to appropriately and easily detect the conversion point.

Second Embodiment

Figure 9A:
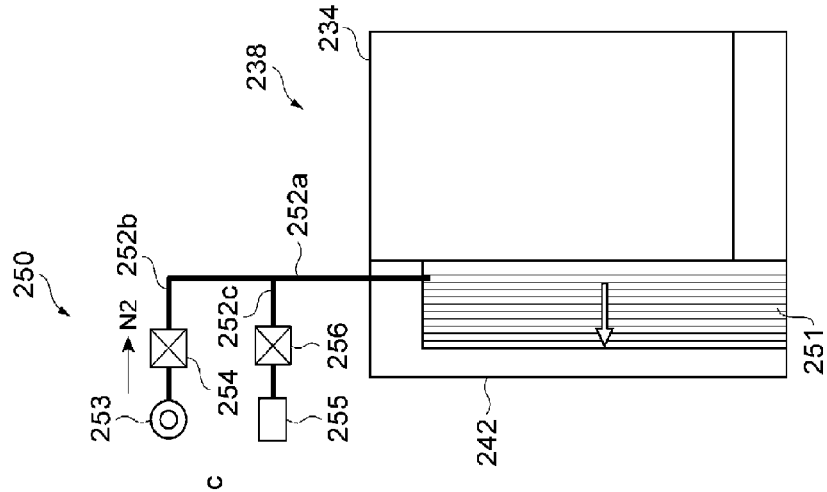
FIG. 9A is a schematic view illustrating a volume-variable mechanism included in a liquid processing apparatus according to a second embodiment in the state in which the volume of an outer tank is increased.
Figure 9B:
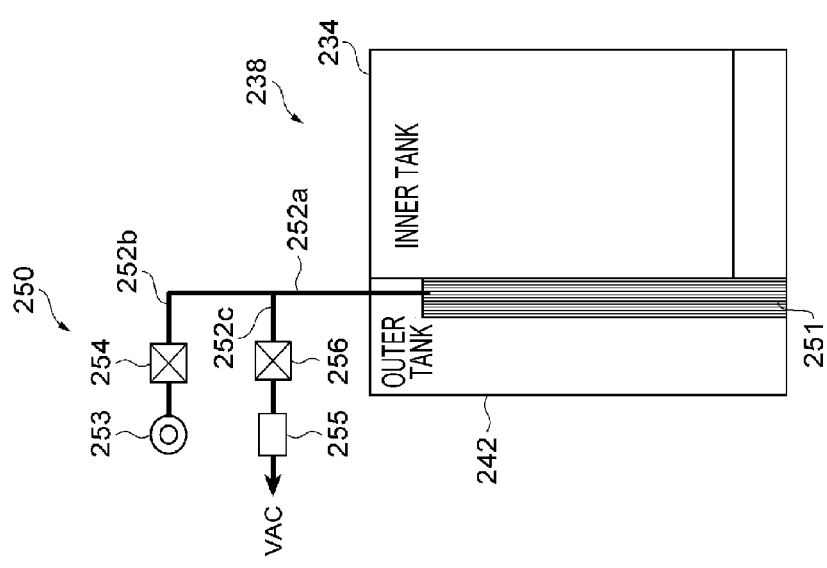
FIG. 9B is a schematic view illustrating a volume-variable mechanism included in a liquid processing apparatus according to the second embodiment in the state in which the volume of the outer tank is decreased.

A liquid processing apparatus according to a second embodiment will be described. In the following, features different from those of the first embodiment will be mainly described. As illustrated in FIGS. 9A and 9B, the liquid processing apparatus according to the second embodiment includes a volume-variable mechanism 250 configured to change the volume of a processing liquid storage section 238 in addition to respective components of the liquid processing apparatus A1 described above.

First, the purpose of providing the volume-variable mechanism 250 will be described. In the configuration in which the concentration of a processing liquid (phosphoric acid concentration), which is a processing condition, is changed, for example, in the case in which the concentration of phosphoric acid is increased, it is conceivable that the liquid level in an outer tank 242 of the processing liquid storage section 238 is lowered and the liquid level fluctuation in the outer tank 242 is increased so that the liquid level may exceed a liquid level management width. In this case, the liquid processing may not be properly performed. In order to prevent such a situation, for example, it is conceivable to increase the volume of the outer tank. However, in that case, the total volume of the processing liquid is increased, which causes a problem in that the consumption of the processing liquid is increased. The liquid processing apparatus according to the second embodiment is provided with a volume-variable mechanism 250 configured to be able to appropriately change the volume of the processing liquid storage section 238, more particularly, the volume of the outer tank 242. By providing the volume-variable mechanism 250, it is possible to change the volume of the outer tank 242 depending on the volume of the processing liquid. Thus, it is possible to prevent the liquid level in the outer tank 242 from being out of the management range.

The volume-variable mechanism 250 includes an expansion/contraction unit 251, supply pipes 252a, 252b, 252c, a nitrogen supply source 253, a valve 254, a suction unit 255, and a valve 256. The expansion/contraction unit 251 is a member formed in a bellows shape using, for example, a resin material, and is configured to be expandable and contractible. The expansion/contraction unit 251 is provided in the outer tank 242. The expansion/contraction unit 251 is configured to expand when nitrogen gas is supplied from the nitrogen supply source 253 and to contract when the nitrogen gas is sucked by the suction unit 255. The supply pipe 252a is connected to the expansion/contraction unit 251, and the supply pipes 252b, 252c are branched from the supply pipe 252a. The supply pipe 252b is provided with the nitrogen supply source 253 and the valve 254. The supply pipe 252c is provided with the suction unit 255 and the valve 256. In the volume-variable mechanism 250, when the valve 256 is closed and the valve 254 is opened, nitrogen gas is supplied from the nitrogen source 253 to the expansion/contraction unit 251 and the expansion/contraction unit 251 expands (see, e.g., FIG. 9B). In addition, in the volume-variable mechanism 250, when the valve 254 is closed and the valve 256 is opened, the interior of the expansion/contraction unit 251 is sucked by the suction unit 255 and the expansion/contraction unit 251 contracts (see, e.g., FIG. 9A). In addition, the suction unit 255 may be an ejector rather than a vacuum mechanism. In this volume-variable mechanism 250, the expansion/contraction unit 251 is configured to be expandable and contractable in the outer tank 242 when the pressure inside the expansion/contraction unit 251 changes, and it is possible to appropriately and easily change the volume of the expansion/contraction unit 251 (i.e., the volume of the outer tank 242).

Third Embodiment

Figure 10B:
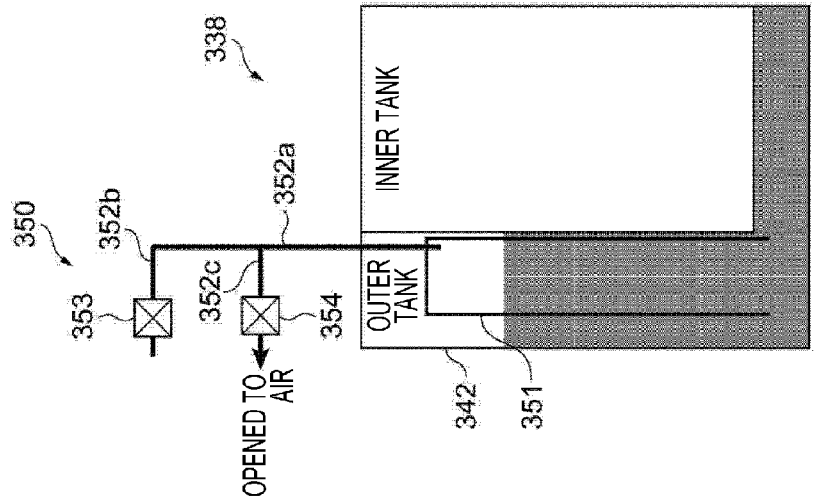
FIG. 10B is a schematic view illustrating a volume-variable mechanism included in a liquid processing apparatus according to the third embodiment in the state in which the volume of the outer tank is increased.
Figure 10A:
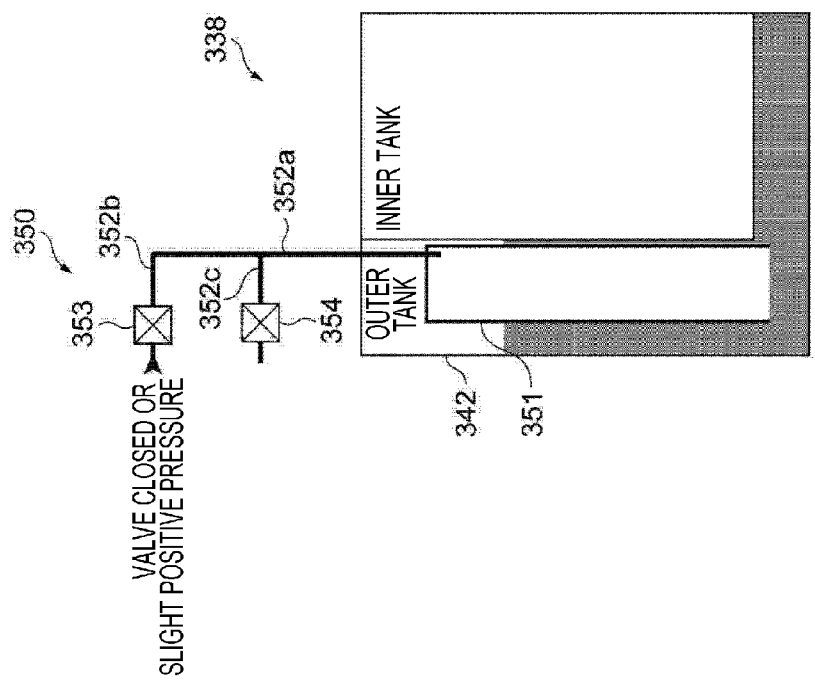
FIG. 10A is a schematic view illustrating a volume-variable mechanism included in a liquid processing apparatus according to a third embodiment in the state in which the volume of an outer tank is decreased.

A liquid processing apparatus according to a third embodiment will be described. In the following, features different from those of each of the above-described embodiments will be mainly described. As illustrated in FIGS. 10A and 10B, the liquid processing apparatus according to the third embodiment includes a volume-variable mechanism 350 configured to change the volume of a processing liquid storage section 338 in addition to respective components of the liquid processing apparatus A1 described above. The purpose of providing the volume-variable mechanism 350 is the same as that of the second embodiment described above.

The volume-variable mechanism 350 includes a cavity unit 351, supply pipes 352a, 352b, 352c, a valve 353, and a valve 354. The cavity 351 is a member having a hollow structure, and is provided in the outer tank 342. The supply pipe 352a is connected to the cavity unit 351, and supply pipes 352b, 352c are branched from the supply pipe 352a. The supply pipe 352b is provided with the valve 353. The supply pipe 352c is provided with the valve 354. In the volume-variable mechanism 350, when the valve 354 is closed and the valve 353 is closed (or when a slight positive pressure is set), the cavity unit 351 is filled with gas and the processing liquid does not enter the cavity unit 351 (see, e.g., FIG. 10A). In this case, it is possible to reduce the volume of the outer tank 342. In addition, in the volume-variable mechanism 350, when the valve 353 is closed and the valve 354 is opened, thereby being opened to the air, the gas is released from the cavity 351 and the processing liquid enters the cavity 351 (see, e.g., FIG. 10B). In this case, it is possible to increase the volume of the outer tank. In this volume-variable mechanism 350, it is possible to appropriately and easily change the volume of the outer tank 342 by a simple configuration in which the cavity unit 351 is filled with gas (or gas is released from the cavity unit 351).

Fourth Embodiment

Figure 11A:
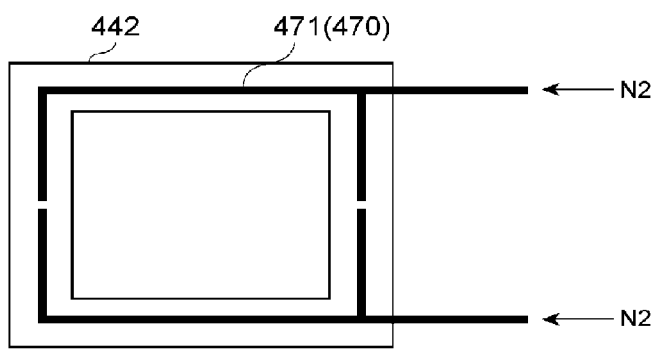
FIGS. 11A, 11B, and 11C are a top plan view, a front view, and a side view, respectively, which illustrate a bubble generation mechanism included in a substrate processing apparatus according to a fourth embodiment.
Figure 11B:
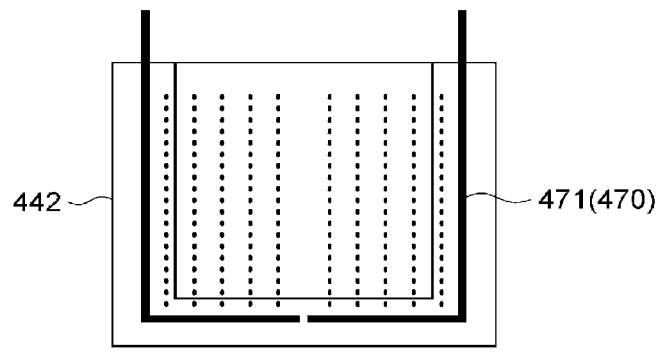
Figure 11C:
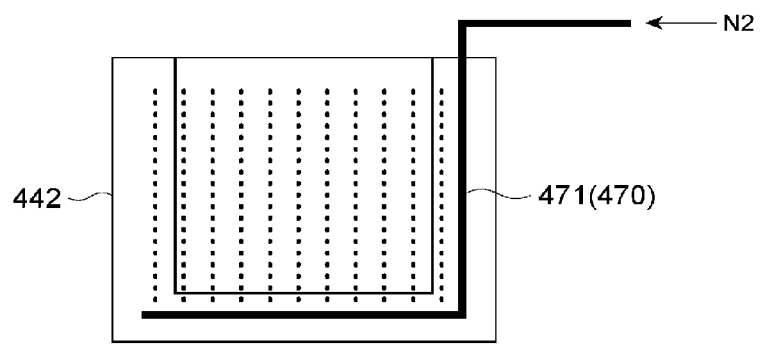

A liquid processing apparatus according to a fourth embodiment will be described. In the following, features different from those of each of the above-described embodiments will be mainly described. FIGS. 11A, 11B, and 11C are a top plan view, a front view, and a side view, respectively, which illustrate a bubble generation mechanism 470 included in the substrate processing apparatus according to the fourth embodiment. As illustrated in FIGS. 11A to 11C, a liquid processing apparatus according to the fourth embodiment includes a bubble generation mechanism 470 configured to perform bubbling within the outer tank 442 in addition to respective components of the liquid processing apparatus A1 described above. The bubble generation mechanism 470 has the same configuration as the bubble generation mechanism 111 described in the first embodiment. However, the bubble generation mechanism 111 is provided in the processing tank 34, whereas the bubble generation mechanism 470 is provided in the outer tank 442.

First, the purpose of providing the bubble generation mechanism 470 in the outer tank 442 will be described. In a general etching apparatus, a substrate is immersed in the processing liquid in a processing tank, and the substrate is etched in the state in which the upper portion of the processing liquid storage section is closed by a bath lid (cover). By using the bath lid, it is possible to improve the stability of the temperature and concentration of the processing liquid during the liquid processing process. Meanwhile, when the bath lid is used, water is difficult to evaporate. Thus, when the concentration or temperature is made to be variable, specifically, when the concentration is increased or the temperature is decreased, each change time is increased. This causes a problem in that the throughput of the liquid processing is reduced. In view of the above, in the liquid processing apparatus according to the fourth embodiment, the bubble generation mechanism 470 is provided in the outer tank 442 as a configuration for promoting evaporation in order to implement concentration increase and temperature decrease of the processing liquid in a short period of time. Since the bubbling is performed in the outer tank 442 by the bubble generation mechanism 470, it is possible to increase a gas-liquid interface (where gas and liquid surface are in contact with each other) in the outer tank 442, whereby evaporation is promoted and it is possible to shorten the time required for concentration increase and temperature decrease of the processing liquid.

The bubble generation mechanism 470 supplies nitrogen gas supplied from a nitrogen source (not illustrated) from the supply pipe 471 into the outer tank 442. The supply pipe 471 is provided along the shape of the outer tank 442 as illustrated in FIG. 11A, and ejects nitrogen gas from the gas nozzle such that bubbling is performed from the bottom side of the outer tank 442.

Here, as shown in FIGS. 12A and 12B, the controller 7 may control the bubble generation mechanism 470 such that the bubble generation amount changes depending on the deviation of the concentration and temperature from target values. That is, in the case in which the concentration of the processing liquid is increased, the controller 7 controls the bubble generation mechanism 470 such that, as the deviation of the concentration from the target value is larger (the increase width is larger), a larger amount of bubbles is generated. For example, in the example illustrated in FIG. 12A, when the increase width (concentration difference) is larger than 3 [wt %], the controller 7 controls the bubble generation mechanism 470 to set the nitrogen gas flow rate to 3 [L/min], when the increase width (concentration difference) is 1.1 to 2.9 [wt %], the controller 7 controls the bubble generation mechanism 470 to set the nitrogen gas flow rate to 2 [L/min], and when the increase width (concentration difference) is smaller than 1 [wt %], the controller 7 controls the bubble generation mechanism 470 to set the nitrogen gas flow rate to 1 [L/min]. In addition, in the case in which the temperature of the processing liquid is decreased, the controller 7 controls the bubble generation mechanism 470 such that, as the deviation of the temperature from the target value is larger (the decrease width is larger), a larger amount of bubbles is generated. For example, in the example illustrated in FIG. 12B, when the decrease width (temperature difference) is larger than 3 [° C.], the controller 7 controls the bubble generation mechanism 470 to set the nitrogen gas flow rate to 3 [L/min], when the decrease width (temperature difference) is 1.1 to 2.9 [° C.], the controller 7 controls the bubble generation mechanism 470 to set the nitrogen gas flow rate to 2 [L/min], and when the decrease width (temperature difference) is smaller than 1 [° C.], the controller 7 controls the bubble generation mechanism 470 to set the nitrogen gas flow rate to 1 [L/min]. By controlling in this manner, it is possible to increase the gas-liquid interface in the outer tank 442 as the increase width of the concentration or the decrease width of the temperature is larger, so that it is possible to effectively shorten the time required for the increase of the concentration of the processing liquid or the decrease of the temperature of the processing liquid.

Fifth Embodiment

A liquid processing apparatus according to a fifth embodiment will be described. In the following, features different from those of each of the above-described embodiments will be mainly described. Like the liquid processing apparatus according to the fourth embodiment, the liquid processing apparatus according to the fifth embodiment has a configuration for shortening the time required for increasing the concentration of the processing liquid. Specifically, in the liquid processing apparatus according to the fifth embodiment, the opening degree of the valve 61B (a flow rate control valve) provided in the vent line 60 (a discharge flow path) illustrated in FIG. 2 is adjusted, so that the amount of water vapor to be discharged is adjusted depending on the increase width of the concentration. The valve 61B adjusts the amount of water vapor discharged from the vent line 60. By adjusting the opening degree of the valve 61B (a flow rate control valve), the amount of water vapor to be discharged is adjusted depending on the increase width of the concentration. That is, in the case in which the concentration of the processing liquid is increased, the controller 7 controls the valve 61B such that a larger amount of water vapor is discharged as the deviation of the concentration from the target value is larger. In the example illustrated in FIG. 13, when the increase width (concentration difference) is larger than 3 [wt %], the controller 7 controls the valve 61B to set the discharged vent flow rate to 10 [L/min], when the increase width (concentration difference) is 1.1 to 2.9 [wt %], the controller 7 controls the valve 61B to set the vent flow rate to 7 [L/min], and when the increase width (concentration difference) is smaller than 1 [wt %], the controller 7 controls the valve 61B to set the vent flow rate to 4 [L/min]. This makes it possible to increase the amount of water vapor to be discharged as the increase width of the concentration is larger, so that it is possible to effectively shorten the time required for increasing the concentration of the processing liquid.

Sixth Embodiment

Figure 14:
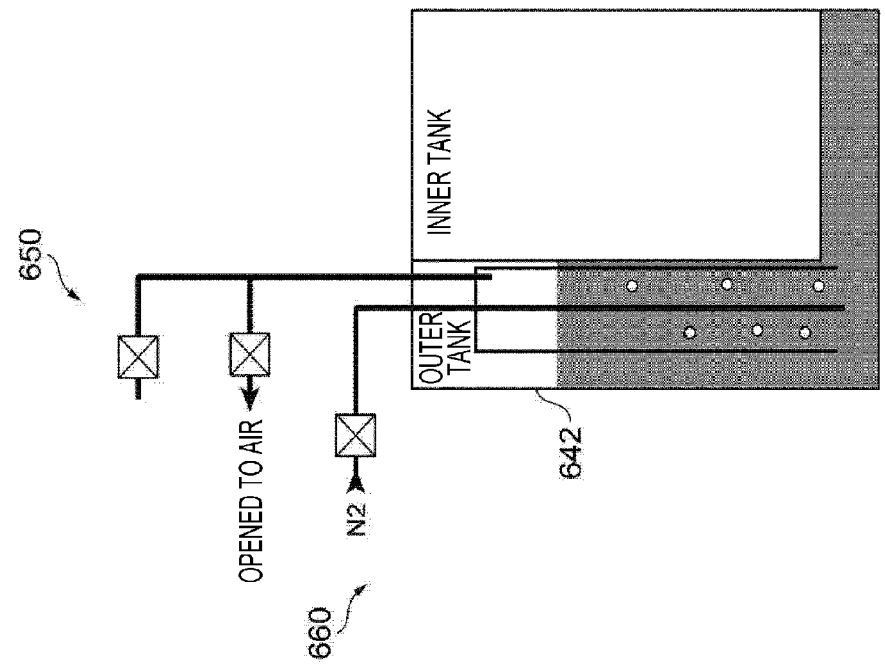
FIG. 14 is a schematic view illustrating a volume-variable mechanism included in the substrate processing apparatus according to a sixth embodiment.

A liquid processing apparatus according to a sixth embodiment will be described. In the following, features different from those of each of the above-described embodiments will be mainly described. The liquid processing apparatus according to the sixth embodiment has a configuration obtained by combining the configuration of the liquid processing apparatus (see, e.g., FIGS. 10A and 10B) according to the third embodiment and the configuration of the liquid processing apparatus (see, e.g., FIGS. 11A to 11C) according to the fourth embodiment. That is, the liquid processing apparatus according to the third embodiment includes a volume-variable mechanism 650 configured to be able to change the volume of the outer tank 642 and a bubble generation mechanism 660 configured to perform bubbling in the outer tank 642, as illustrated in FIG. 14. The configuration of the volume-variable mechanism 650 is similar to that of the volume-variable mechanism 350 of the third embodiment, and the configuration of the bubble generation mechanism 660 is similar to that of the bubble generation mechanism 470 of the fourth embodiment. According to such a configuration, it is possible to implement both the control of the liquid level by changing the volume of the outer tank 642 and the shortening of the processing time by increasing the gas-liquid interface in the outer tank 642.

For example, the step of changing the processing conditions may be performed after a substrate is carried out from the processing tank that stores the processing liquid after the step of processing the substrate. In this case, it is possible to appropriately change the processing conditions without affecting the substrate processing.

Although the change point of the slope of the temporal change of the silicon concentration has been described as being specified as the conversion point, the method of specifying the conversion point is not limited thereto. For example, based on a processing time predetermined depending on a pattern formed on the substrate, the controller may specify, as the conversion point, a time point at which the processing time has elapsed after immersing the substrate in the processing liquid. Thus, it is possible to appropriately and easily detect the conversion point by setting a processing time depending on a pattern shape in advance. In addition, the specification of the conversion point may be performed based on the image or temperature of a processing liquid. In addition, although the processing liquid storage section has been described as including the outer tank and the inner tank, it is configured with a single tank (e.g., only the tank corresponding to the inner tank) or with three or more tanks.

According to the present disclosure, it is possible to change processing parameters at an appropriate timing in an immersion etching process.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing method comprising:
   immersing a substrate in a processing liquid supplied by a processing liquid supply, thereby processing the substrate;
   detecting a conversion point at which a processing condition of the processing the substrate is changed; and
   changing the processing condition by controlling the processing liquid supply and a heater configured to heat the processing liquid when the conversion point is detected,
   wherein, based on a predetermined processing time depending on a pattern formed on the substrate, the conversion point is detected by specifying a time point at which the predetermined processing time has elapsed after immersing the substrate in the processing liquid.

2. A non-transitory computer-readable storage medium that stores a liquid processing program which causes a computer to perform the liquid processing method according to claim 1.

3. The liquid processing method according to claim 1, wherein, in the detecting the conversion point, a concentration of a component contained in the processing liquid is detected, and the conversion point is detected based on the slope of the temporal change of the concentration of the component.

4. The liquid processing method according to claim 3, wherein, in the changing the processing condition, at least one of a concentration of the processing liquid and the concentration of the component contained in the processing liquid is changed when the conversion point is detected.

5. The liquid processing method according to claim 4, wherein, in the changing the processing condition, the concentration of the processing liquid is decreased when the conversion point is detected.

6. The liquid processing method according to claim 5, wherein, in the changing the processing condition, the concentration of the component contained in the processing liquid is increased when the conversion point is detected.

7. The liquid processing method according to claim 6, wherein, in the changing the processing condition, a volume of the processing liquid in which the substrate is immersed is changed.

8. The liquid processing method according to claim 7, wherein the changing the processing condition is executed after the substrate is carried out from a processing tank that stores the processing liquid after processing the substrate.

9. A liquid processing apparatus for performing a liquid-processing on a substrate, the liquid processing apparatus comprising:
a processing liquid storage configured to store a processing liquid in which a substrate is immersed;
a processing liquid supply configured to supply the processing liquid to the processing liquid storage;
a heater configured to heat the processing liquid; and
a controller,
wherein the controller is configured to:
specify the conversion point based on information on a conversion point at which a processing condition for the substrate is changed, and
control the processing liquid supply and the heater such that the processing condition is changed when the conversion point is specified,
wherein, based on a predetermined processing time depending on a pattern formed on the substrate, the conversion point is detected by specifying a time point at which the predetermined processing time has elapsed after immersing the substrate in the processing liquid.

10. The liquid processing apparatus according to claim 9, further comprising:
a detector configured to detect a concentration of a component contained in the processing liquid as the information on the conversion point.

11. The liquid processing apparatus according to claim 10, wherein the controller is configured to specify a change point of a slope of a temporal change of the concentration of the component contained in the processing liquid as the conversion point.

12. The liquid processing apparatus according to claim 11, further comprising:
a volume-variable provided in the processing liquid storage and configured to change a volume of the processing liquid storage.

13. The liquid processing apparatus according to claim 12, wherein the volume-variable is configured to expand/contract in the processing liquid storage when a pressure therein is changed.

14. The liquid processing apparatus according to claim 12, wherein the volume-variable has a hollow structure, and is configured to decrease the volume of the processing liquid storage when an interior thereof is filled with a gas, and increase the volume of the processing liquid storage when the gas is discharged from the interior thereof.

15. The liquid processing apparatus according to claim 14, further comprising:
a bubble generator configured to perform a bubbling in the processing liquid storage.

16. The liquid processing apparatus according to claim 15, wherein the processing liquid storage includes an inner tank configured to immerse the substrate therein, an outer tank configured to receive the processing liquid overflowing from the inner tank, and a circulation path configured to circulate the processing liquid from the outer tank to the inner tank, and
at least one of the volume-variable and the bubble generator is provided in the outer tank.

17. The liquid processing apparatus according to claim 16, wherein the bubble generator is provided in the outer tank, and
the controller is configured to:
control the bubble generator such that a larger amount of bubbles is generated as a deviation from a target value of the concentration becomes larger when increasing the concentration of the processing liquid, and
control the bubble generator such that a larger amount of bubbles is generated as a deviation from a target value of the temperature becomes larger when decreasing the temperature of the processing liquid.

18. The liquid processing apparatus according to claim 17, further comprising:
a flow rate control valve provided in a discharge flow path branched from the circulation path, and configured to adjust an amount of water vapor discharged from the discharge flow path.

19. The liquid processing apparatus according to claim 18, wherein the controller is configured to control the flow rate control valve such that a larger amount of water vapor is discharged as the deviation from a target value of the concentration becomes larger when increasing the concentration of the processing liquid.

* * * * *